United States Patent
Kuo et al.

(10) Patent No.: US 8,269,316 B2
(45) Date of Patent: Sep. 18, 2012

(54) SILICON BASED SUBSTRATE AND MANUFACTURING METHOD THEREOF

(75) Inventors: Chien-Li Kuo, Hsinchu (TW); Jui-Hung Cheng, Hsinchu County (TW)

(73) Assignee: Victory Gain Group Corporation, The Valley (AI)

( * ) Notice: Subject to any disclaimer, the term of this patent is extended or adjusted under 35 U.S.C. 154(b) by 154 days.

(21) Appl. No.: 12/831,431

(22) Filed: Jul. 7, 2010

(65) Prior Publication Data

US 2012/0007249 A1    Jan. 12, 2012

(51) Int. Cl.
*H01L 29/40* (2006.01)

(52) U.S. Cl. ........ 257/621; 257/698; 257/774; 257/758; 257/E23.011; 257/E23.174; 257/E21.597; 438/667; 438/700

(58) Field of Classification Search ................... 257/621, 257/698, 774, 758, E23.011, E23.174, E21.597; 438/667, 700
See application file for complete search history.

(56) References Cited

U.S. PATENT DOCUMENTS

| | | | |
|---|---|---|---|
| 6,878,608 B2 | 4/2005 | Brofman et al. | |
| 7,189,595 B2 | 3/2007 | Magerlein et al. | |
| 2002/0180013 A1 | 12/2002 | Brofman et al. | |
| 2004/0229398 A1 | 11/2004 | Magerlein et al. | |
| 2006/0071347 A1* | 4/2006 | Dotta | 257/781 |
| 2007/0111385 A1 | 5/2007 | Magerlein et al. | |
| 2009/0174059 A1 | 7/2009 | Magerlein et al. | |
| 2011/0248404 A1* | 10/2011 | Chiu et al. | 257/773 |
| 2011/0291288 A1* | 12/2011 | Wu et al. | 257/774 |

* cited by examiner

*Primary Examiner* — Tu-Tu Ho
(74) *Attorney, Agent, or Firm* — Chun-Ming Shih (57) ABSTRACT

A silicon based substrate includes a silicon wafer, a first circuit substrate and a second circuit substrate. The silicon wafer includes a first surface and a second surface and at least a through silicon via. The first circuit substrate is disposed on the first surface and includes a plurality of first dielectric layers and a plurality of first conductive trace layers alternately stacked. The second circuit substrate is disposed on the second surface and includes a plurality of second dielectric layers and a plurality of second conductive trace layers alternately stacked. The trace density of the first conductive trace layers is higher than the trace density of the second conductive trace layers. Otherwise, the first dielectric layer includes an inorganic material and the second dielectric layer includes an organic material. A manufacturing method of the silicon based substrate is also provided.

13 Claims, 7 Drawing Sheets

SILICON BASED SUBSTRATE AND MANUFACTURING METHOD THEREOF

BACKGROUND

1. Field of the Invention

The present invention relates to a silicon based substrate, and particularly to a silicon based substrate having an asymmetric structure and a manufacturing method of silicon based substrate.

2. Description of the Related Art

Currently, a conventional silicon based substrate is often designed following a symmetric design rule of a convention circuit board, thereby having a symmetric structure. That is, the stacking circuit structures and the dielectric materials on two opposite sides of the silicon based substrate are identical.

Generally, the conventional silicon based substrate is applied to an electronic product. A stacking circuit structure on one side of the silicon wafer is used for electrically connecting to an electronic component. A stacking circuit structure on the other side of the silicon wafer is used for electrically connecting to a printed circuit board in a package process. It is a trend that the silicon based substrate has a high trace density due to the diversification of the function of the electronic product. If the silicon based substrate is still manufactured following the symmetric design rule of the conventional circuit board, both the stacking circuit structure having the high trace density on one side of the silicon wafer used for electrically connecting to the electronic component and the stacking circuit structure having the high trace density on the other side of the silicon wafer used for electrically connecting to the printed circuit board are needed to be manufactured. However, in fact, it is not necessary for the circuit structure on the other side of the silicon wafer used for electrically connecting to a printed circuit board in the package to have the high trace density. Thus, the resources for manufacturing the stacking circuit structure having the high trace density is wasted, thereby increasing the production cost. In addition, in the actual manufacturing process, the stacking circuit structure on the other side of the silicon wafer used for electrically connecting to the printed circuit board in the package process is formed in a package factory. However, many package factories can not manufacture the stacking circuit structure having the high trace density by using the current apparatuses and processes.

Therefore, what is needed is a silicon based substrate and a manufacturing method of a silicon based substrate to overcome the above disadvantages.

BRIEF SUMMARY

The present invention provides a silicon based substrate having an asymmetric structure so as to satisfy the utility demand, thereby reducing the production cost.

The present invention also provides a manufacturing method of a silicon based substrate having an asymmetric structure so as to satisfy the utility demand, thereby reducing the production cost.

To achieve the above-mentioned advantages, an embodiment of the present invention provides a silicon based substrate includes a silicon wafer, a first circuit substrate and a second circuit substrate. The silicon wafer includes a first surface and a second surface opposite to the first surface, and includes at least a through silicon via penetrating the first surface and the second surface. The first circuit substrate is disposed on the first surface of the silicon wafer and includes a plurality of first dielectric layers and a plurality of first conductive trace layers alternately stacked. The second circuit substrate is disposed on the second surface of the silicon wafer and includes a plurality of second dielectric layers and a plurality of second conductive trace layers alternately stacked. The at least a through silicon via is respectively electrically connected to the bottommost first conductive trace layer of the first circuit substrate and the uppermost second conductive trace layer of the second circuit substrate. The trace density of the first conductive trace layers is higher than the trace density of the second conductive trace layers.

In one embodiment of the present invention, the first circuit substrate is fabricated by a wafer level semiconductor process.

In one embodiment of the present invention, the silicon based substrate further includes a first protecting layer and a second protecting layer. The first protecting layer covers the first circuit substrate and the second protecting layer covers the second circuit substrate.

In one embodiment of the present invention, the first circuit substrate further includes an under bump metallization formed in a first opening of the first circuit substrate and electrically connected to the first conductive trace layers.

In one embodiment of the present invention, the first circuit substrate further includes a plurality of passive devices electrically connected to the first conductive trace layers.

To achieve the above-mentioned advantages, an embodiment of the present invention provides a silicon based substrate includes a silicon wafer, a first circuit substrate and a second circuit substrate. The silicon wafer includes a first surface and a second surface opposite to the first surface, and defines at least a through silicon via penetrating the first surface and the second surface. The first circuit substrate is disposed on the first surface of the silicon wafer and includes a plurality of first dielectric layers and a plurality of first conductive trace layers alternately stacked. The second circuit substrate is disposed on the second surface of the silicon wafer and includes a plurality of second dielectric layers and a plurality of second conductive trace layers alternately stacked. The at least a through silicon via is respectively electrically connected to the bottommost first conductive trace layer of the first circuit substrate and the uppermost second conductive trace layer of the second circuit substrate. The first dielectric layers include an inorganic material, and the second dielectric layers include an organic material.

In one embodiment of the present invention, the inorganic material is selected from a group consisting of silicon oxide, silicon nitride and silicon based material.

In one embodiment of the present invention, the organic material is selected from a group consisting of polyimide and benzocyclobutene.

To achieve the above-mentioned advantages, an embodiment of the present invention also provides a manufacturing method of a silicon based substrate. A silicon wafer including a first surface and a second surface opposite to the first surface is provided. Next, a plurality of first dielectric layers and a plurality of first conductive trace layers are formed on the first surface of the silicon wafer by a wafer level semiconductor process. The first dielectric layers and the first conductive trace layers are alternately stacked to form a first circuit substrate. Next, at least a through silicon via penetrating the first surface and the second surface of the silicon wafer. The at least a through silicon via is electrically connected to the bottommost first conductive trace layer of the first circuit substrate. Next, a plurality of second dielectric layers and a plurality of second conductive trace layers are formed on the second surface of the silicon wafer. The second dielectric layers and the second conductive trace layers are alternately stacked to form a second circuit substrate. The uppermost second conductive trace layer of the second circuit substrate is electrically connected to the at least a through silicon via. The trace density of the first conductive trace layers is higher than the trace density of the second conductive trace layers.

In one embodiment of the present invention, before forming the at least a through silicon via, a wafer thinning process is performed. The silicon wafer thinning process includes grinding the second surface of the silicon wafer so as to form a grinding surface, and etching the grinding surface of the silicon wafer.

In one embodiment of the present invention, the step of forming the at least a through silicon hole includes the following steps. First, at least a through hole penetrating the first surface and the second surface of the silicon wafer is formed so that a portion of the first conductive trace layers of the first circuit substrate is exposed from the at least a through hole. Subsequently, an insulating layer is formed to cover the second surface of the silicon wafer and the sidewall of the at least a through hole. An electrically conductive layer is formed on the insulating layer and filled in the at least a through hole so that the first circuit substrate is electrically connected to the second circuit substrate through the electrically conductive layer.

In one embodiment of the present invention, the first dielectric layers include an inorganic material, and the second dielectric layers include an organic material.

In one embodiment of the present invention, a first protecting layer is formed to cover the first circuit substrate.

In one embodiment of the present invention, a first opening is formed in the first circuit substrate so as to expose a portion of the first conductive trace layers, and forming an under bump metallization in the first opening and electrically connected to the first conductive trace layers.

In one embodiment of the present invention, a second protecting layer is formed to cover the second circuit substrate.

In one embodiment of the present invention, the manufacturing method further includes forming a plurality of passive devices electrically connected to the first conductive trace layers in the first circuit substrate.

In the silicon based substrate and the manufacturing method of the silicon based substrate, the first circuit substrate and the second circuit substrate are respectively located on two opposite sides of the silicon wafer. The trace density of the first conductive trace layers of the first circuit substrate and the trace density of the second conductive trace layers of the second circuit substrate are different, or the material of the first dielectric layers of the first circuit substrate and the material of the second dielectric layers of the second circuit substrate are different. Thus, the silicon based substrate has an asymmetric structure. The conductive traces of the silicon based substrate can be reasonably designed according to the actual utility demand, thereby reducing the production cost. In other words, the wafer level semiconductor process is employed to form the first conductive trace layers of the first circuit substrate for electrically connecting to the electronic component. The trace density of the first conductive trace layers can be higher than the trace density of the second conductive trace layers of the second circuit substrate for electrically connecting to the printed circuit board. Additionally, the first dielectric layers of the first circuit substrate include the inorganic material and the second dielectric layers of the second circuit substrate include the organic material, thereby satisfying the demand of manufacturing the first conductive trace layers and the second conductive trace layers with different trace density.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Referring to FIG. 1A to FIG. 1L, FIG. 1A to FIG. 1L illustrate a process flow of a manufacturing method of a silicon based substrate 10 in accordance with a first embodiment of the present invention.

Figure 1A:
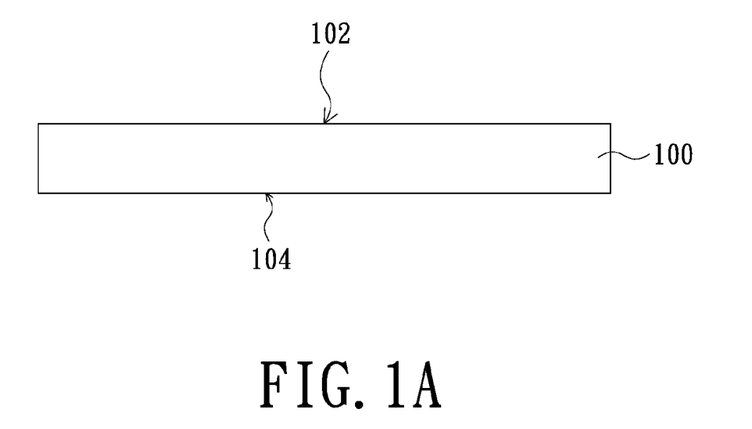
FIG. 1A to FIG. 1L illustrate a process flow of a manufacturing method of a silicon based substrate in accordance with a first embodiment of the present invention.

Referring to FIG. 1A, first, a silicon wafer 100 is provided. The silicon wafer 100 includes a first surface 102 and a second surface 104 opposite to the first surface 102.

Figure 1B:
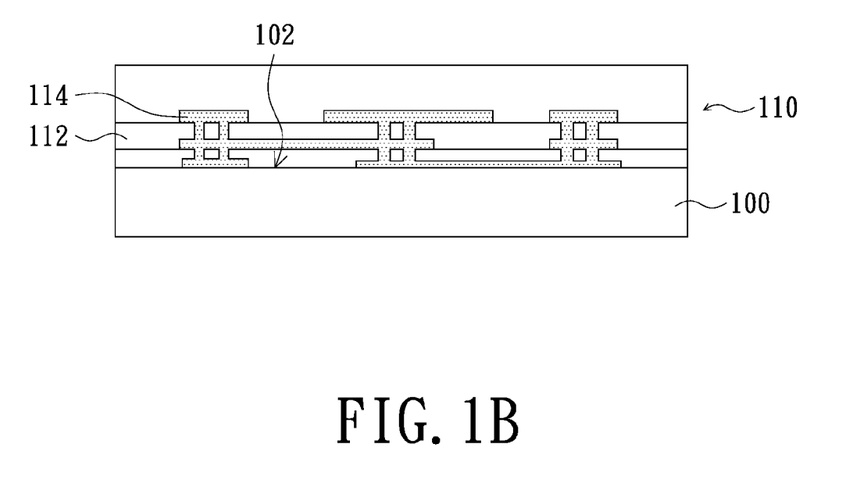

Referring to FIG. 1B, next, a plurality of first dielectric layers 112 and a plurality of first conductive trace layers 114 are formed on the first surface 102 of the silicon wafer 100 by a wafer level semiconductor process. The first dielectric layers 112 and the first conductive trace layers 114 are alternately stacked to form a first circuit substrate 110. Because the wafer level semiconductor process is employed, the trace density of the first conductive trace layers can be nanometer scale. The first dielectric layers 112 include an inorganic material. The inorganic material can be, but not limited to, silicon oxide, silicon nitride or silicon based material.

In addition, during forming the first circuit substrate 110, a plurality of passive devices (not shown) are formed in the first circuit substrate 110. The passive devices are electrically connected to the first conductive trace layers 114 of the first circuit substrate 110.

Figure 1C:
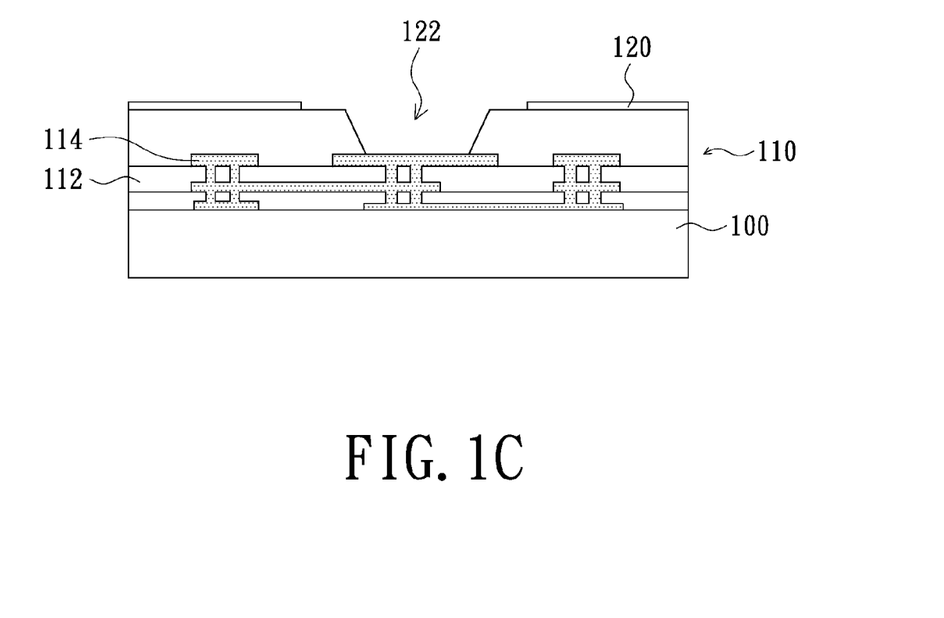

Referring to FIG. 1C, next, a first protecting layer 120 can be formed to cover the first circuit substrate 110. Further, after the first protecting layer 120 is formed, an under bump metallization (UBM) 115 can be formed. Thus, the first circuit substrate 110 can be connected to a bump of other electronic components such as an integrated circuit (IC). In the present embodiment, first, referring to FIG. 1C, a first opening 122 is formed in the first circuit substrate 110. In detail, a portion of the first protecting layer 120 and a corresponding portion of the first dielectric layers 112 are removed so as to expose a portion of the first conductive trace layers 114. The first opening 122 can be formed by a lithography process or an etching process. Subsequently, referring to FIG. 1D, the under bump metallization 115 is formed in the first opening 122. In detail, the under bump metallization 115 is formed on the side wall of the first opening 122 and on the portion of the first conductive trace layers 114 exposed from the first opening 122. The under bump metallization 115 extends outside the first circuit substrate 110, thereby electrically connecting the first conductive trace layers 114 to the bump of other outside electronic component. Material of the under bump metallization 115 can be titanium (Ti), copper (Cu), nickel (Ni), gold (Au) or a combination of the above-mentioned metals. It is noted that the first protecting layer 120 and the under bump metallization 115 can be formed after the second circuit substrate 130 is formed.

Figure 1D:
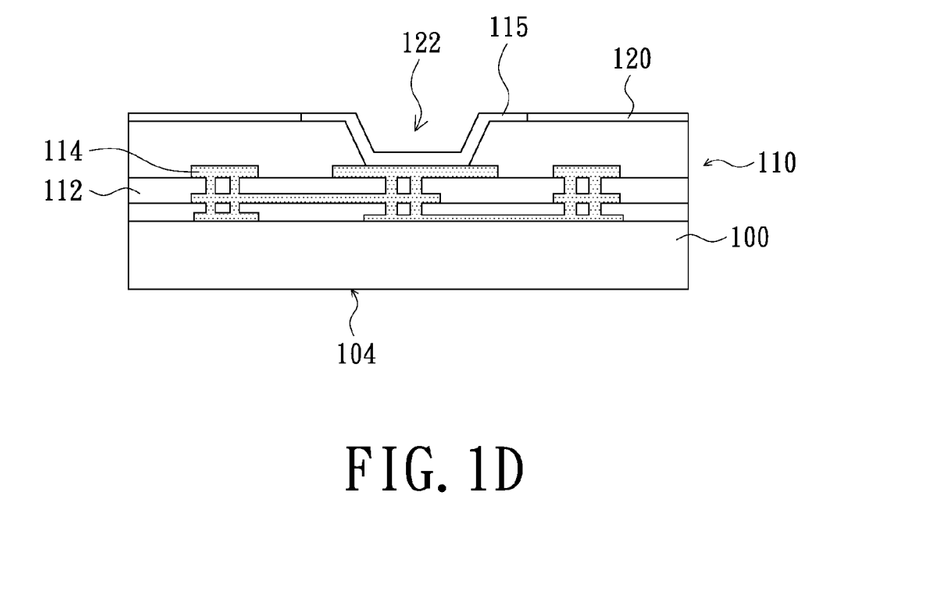
Figure 1E:
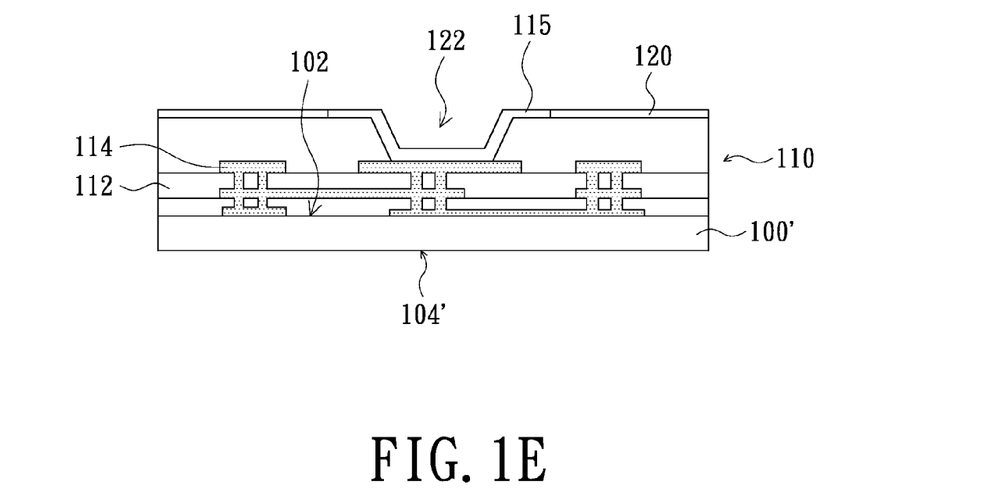

Next, a wafer thinning process can be performed selectively. Thus, the silicon wafer 100 can have a suitable thickness. Referring to FIG. 1D and FIG. 1E, in the wafer thinning process, at first, the second surface 104 of the silicon wafer 100 is ground so as to form a ground surface (not shown). The method for grinding the silicon wafer 100 can be, for example, a milling method, a grinding method or a polishing method. Subsequently, the ground surface of the silicon wafer 100 is etched, thereby obtaining a thinned silicon wafer 100'. The thinned silicon wafer 100' includes the first surface 102 and the second surface 104'.

Referring to FIG. 1F to FIG. 1I, next, at least a through silicon via 20 penetrating the first surface 102 and the second surface 104' of the silicon wafer 100 is formed. In the present embodiment, because the wafer thinning process is performed, the through silicon via 20 penetrates the first surface 102 and the second surface 104' of the thinned silicon wafer 100'.

Figure 1F:
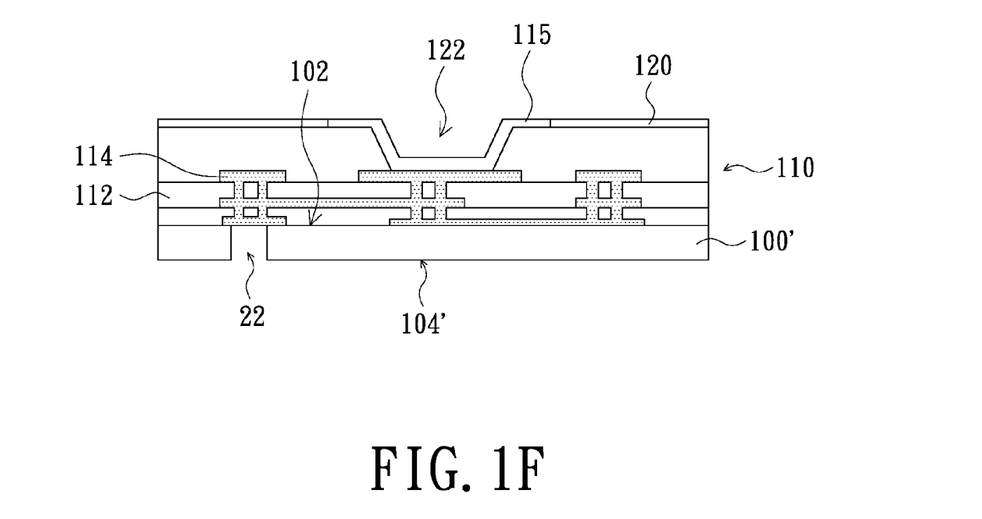
Figure 1G:
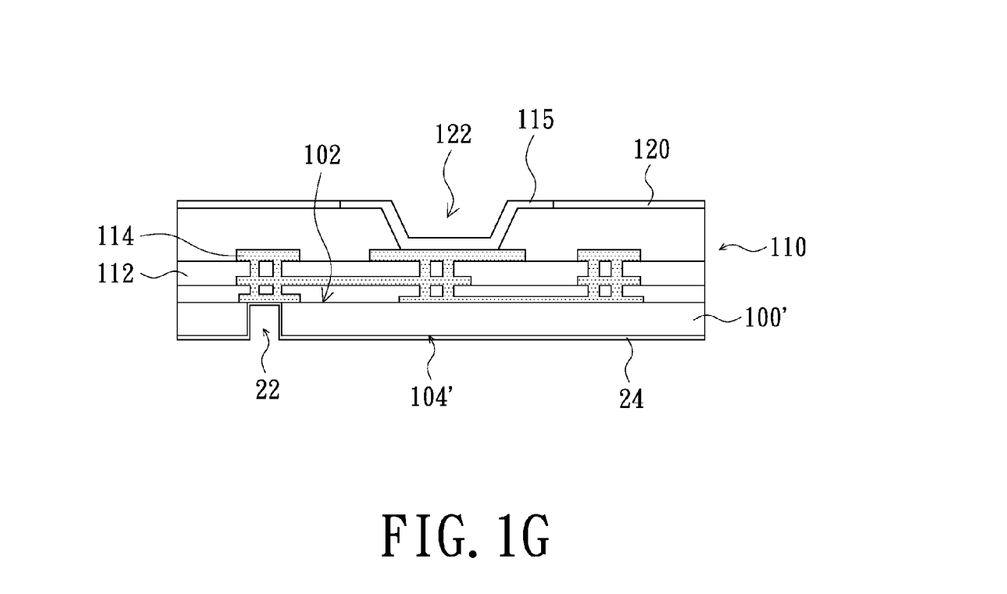
Figure 1H:
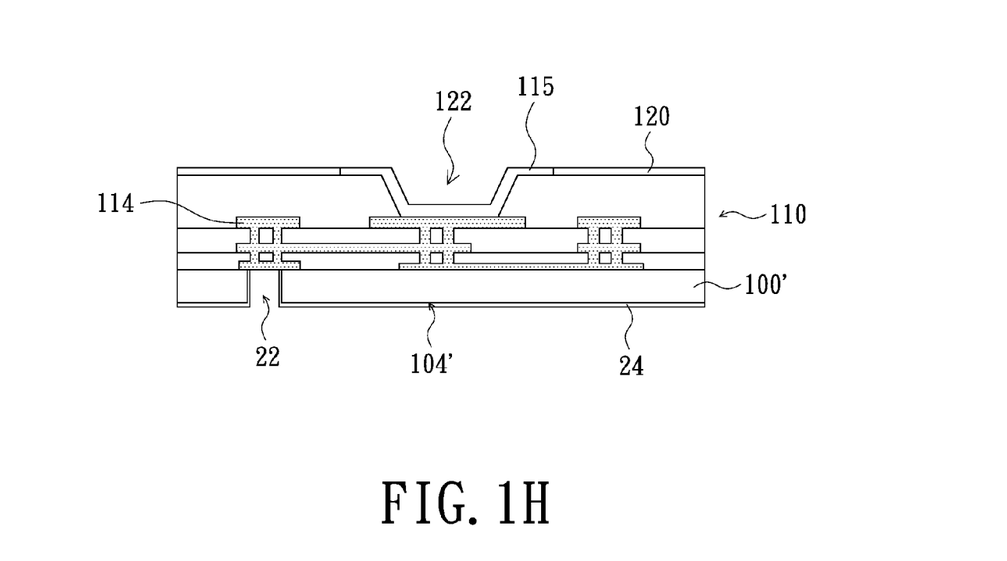
Figure 1I:
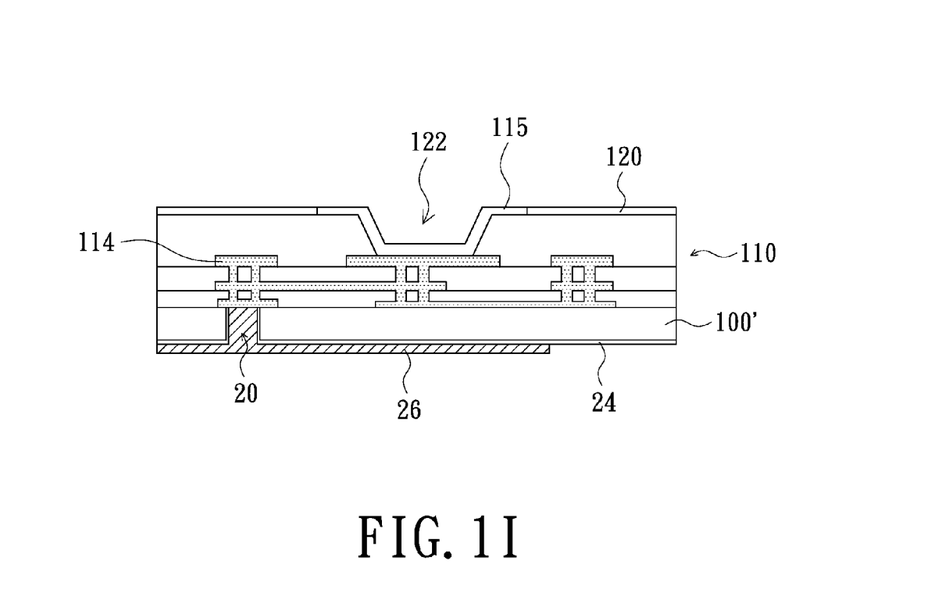

In detail, in the present embodiment, forming the through silicon via 20 includes the following steps. Referring to FIG. 1F, first, a through hole 22 penetrating the first surface 102 and the second surface 104' of the thinned silicon wafer 100' is formed so that a portion of the bottommost first conductive trace layer 114 of the first circuit substrate 110 is exposed from the through hole 22. Subsequently, an insulating layer 24 is formed to cover the second surface 104' of the thinned silicon wafer 100' and the sidewall of the through hole 22. In the present embodiment, the insulating layer 24 is formed by a depositing and etching method. Referring to FIG. 1G, firstly, an insulating material is deposited on the second surface 104' of the thinned silicon wafer 100' by using a chemical vapor deposition method to cover the second surface 104' of the thinned silicon wafer 100', a portion of the bottommost first conductive trace layer 114 and the sidewalls of the through holes 22. Secondly, referring to FIG. 1H, the insulating material is etched to remove the portion of the insulating material on the bottommost first conductive trace layer 114, thereby forming the insulating layer 24. In the present embodiment, the insulating material is, for example, a silicon oxide ($SiO_2$). Referring to FIG. 1I, after the insulating layer 24 is formed, a conductive material is filled in the through hole 22 to form a through silicon via 20. Thus, the through silicon via 20 can be electrically connected to the bottommost first conductive trace layer 114 of the first circuit substrate 110. In the present embodiment, to simplify the process, an electrically conductive layer 26 is formed on the insulating layer 24 and filled in the through hole 22. The electrically conductive layer 26 can be one of the second conductive trace layers 134 of the second circuit substrate 130. The electrically conductive layer 26 can be formed by an electroplating method. In other embodiments, a seed layer (not shown) can be formed in the through hole 22. The seed layer can include, for example, titanium or copper. Then, a conductive material is filled in the through hole 22 by the electroplating method to form the through silicon via 20.

Figure 1J:
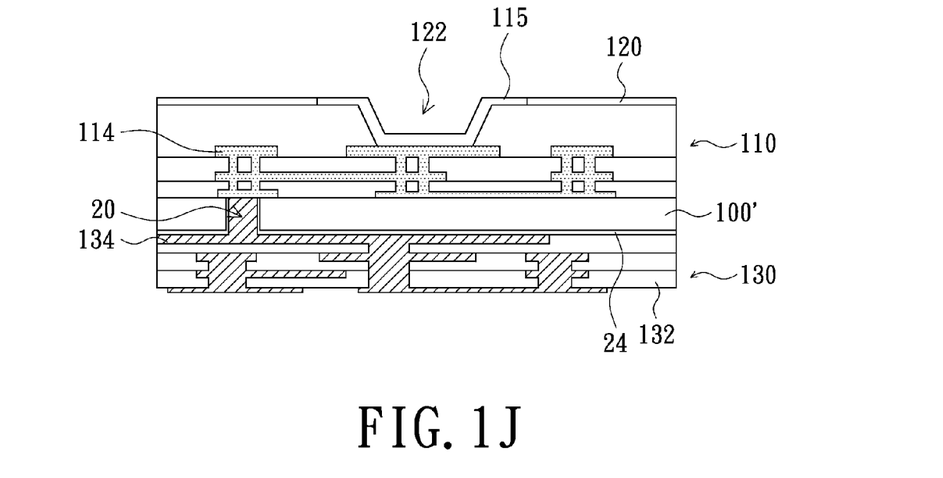

Next, referring to FIG. 1J, a plurality of second dielectric layers 132 and a plurality of second conductive trace layers 134 are formed on the insulating layer 24. The second dielectric layers 132 and the second conductive trace layers 134 are alternately stacked to form a second circuit substrate 130. The uppermost second conductive trace layer 134 (electrically conductive layer 26) of the second circuit substrate 130 is electrically connected to the through silicon via 20. Thus, the first circuit substrate 110 is electrically connected to the second circuit substrate 130 through the electrically conductive layer 26. The trace density of the second conductive trace layers 134 can be micrometer scale. For example, a trace spacing of the copper trace can be 3 micrometers, and a trace spacing of the nickel trace can be 1 micrometer. The trace density of the second conductive trace layers 134 is lower than the trace density of the first conductive trace layers 114. Thus, the second circuit substrate 130 can be formed by a general process during package process. The second dielectric layers 132 include an inorganic material. The inorganic material can be, but not limited to, silicon oxide, silicon nitride or silicon based material.

Figure 1K:
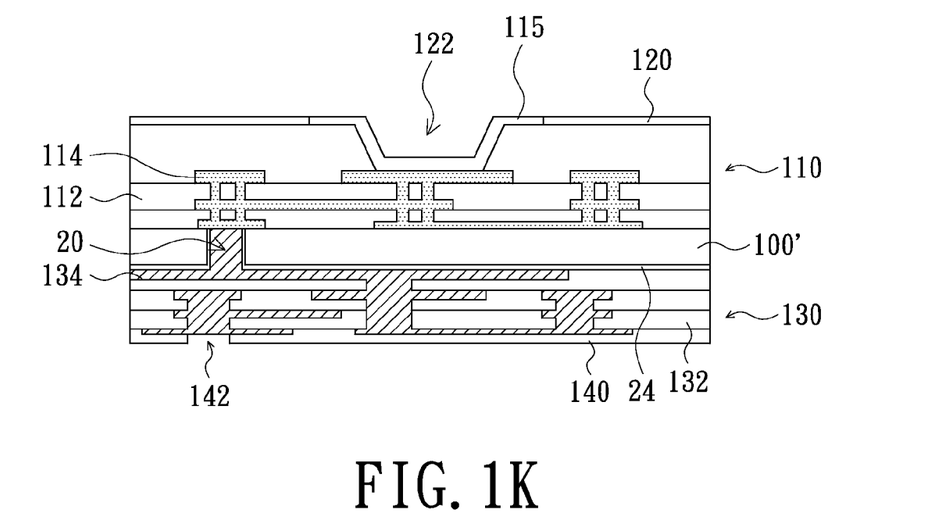
Figure 1L:
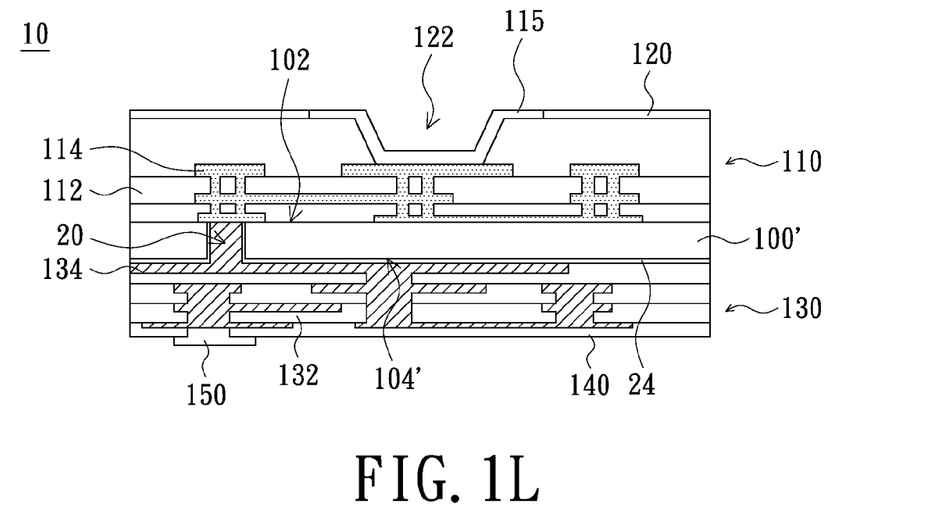

Next, referring to FIG. 1K, a second protecting layer 140 is formed to cover the second circuit substrate 120, thereby protecting the second conductive trace layer 134 exposed. The second protecting layer 140 can be, for example, green paint or solder mask material. Next, in the present embodiment, as shown in FIG. 1K, a second opening 142 is formed in the second protecting layer 140. In detail, a portion of the second protecting layer 140 is removed so that a corresponding portion of the bottommost second conductive trace layer 134 is exposed from the second opening 142. Thus, the second conductive trace layers 134 can be electrically connected to the printed circuit board. The second opening 122 can be formed by a lithography process or an etching process. Additionally, referring to FIG. 1L, an electrically conductive layer 150 can be formed on the second protecting layer 140 and filled in the second protecting layer 140 so that the second bottommost conductive trace layer 134 is electrically connected to the electrically conductive layer 150. The electrically conductive layer can be formed by an electroplating process or a depositing process. The electrically conductive layer 150 is configured for electrically connecting to the printed circuit board. The second conductive trace layers 134 can be electrically connected to the printed circuit board through the electrically conductive layer 150. Referring to FIG. 1L, the silicon based substrate 10 is formed. In detail, a silicon based substrate 10 includes the silicon wafer 100', the first circuit substrate 110 and the second circuit substrate 130. The silicon wafer 100' includes the through silicon via 20 penetrating the first surface 102 and the second surface 104'. The first circuit substrate 110 is disposed on the first surface 102 of the silicon wafer 100' and includes a plurality of first dielectric layers 112 and a plurality of first conductive trace layers 114 alternately stacked. The second circuit substrate 130 is disposed on the second surface 104' of the silicon wafer 100' and includes a plurality of second dielectric layers 132 and a plurality of second conductive trace layers 134 alternately stacked. The through silicon via 20 is respectively electrically connected to the bottommost first conductive trace layer 114 of the first circuit substrate 110 and the uppermost second conductive trace layer 134 of the second circuit substrate 130. The trace density of the first conductive trace layers 114 is higher than the trace density of the second conductive trace layers 134. In addition, the first dielectric layers 112 and the second dielectric layers 132 include the inorganic material respectively.

Figure 2:
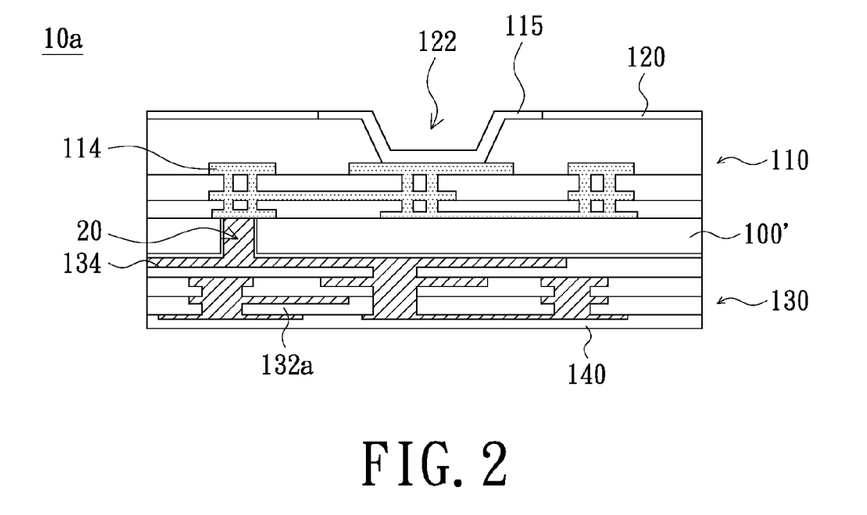
FIG. 2 is a schematic, cross-sectional view of a silicon based substrate in accordance with a second embodiment of the present invention.

Referring to FIG. 2, FIG. 2 is a schematic, cross-sectional view of a silicon based substrate 10a in accordance with a second embodiment of the present invention. The silicon based substrate 10a is similar to the silicon based substrate 10 except that the first dielectric layers 112 include the inorganic material and the second dielectric layers 132a include the organic material. The inorganic material can be, but not limited to, silicon oxide, silicon nitride or silicon based material. The organic material can be, but not limited to, polyimide or benzocyclobutene. The trace density of the first conductive trace layer 114 and the trace density of the second conductive trace layer 134 can be reasonably designed according to the material of the first dielectric layers 112 and the second dielectric layers 114. For example, the trace density of the first conductive trace layers 114 can be higher than or equal to the trace density of the second conductive trace layers 134.

In summary, the silicon based substrate and the manufacturing method of the silicon based substrate of the present invention have at least the following advantages.

1. The first circuit substrate and the second circuit substrate are respectively located on two opposite sides of the silicon wafer. The trace density of the first conductive trace layers of the first circuit substrate and the trace density of the second conductive trace layers of the second circuit substrate are different, or the material of the first dielectric layers of the first circuit substrate and the material of the second dielectric layers of the second circuit substrate are different. Thus, the silicon based substrate has an asymmetric structure.

2. The conductive traces of the silicon based substrate can be reasonably designed according to the actual utility demand, thereby reducing the production cost. In other words, the wafer level semiconductor process is employed to form the first conductive trace layers of the first circuit substrate for electrically connecting to the electronic component. The trace density of the first conductive trace layers can be higher than the trace density of the second conductive trace layers of the second circuit substrate, the second circuit substrate is used for electrically connecting to the printed circuit board.

3. The first dielectric layers of the first circuit substrate include the inorganic material and the second dielectric layers of the second circuit substrate include the organic material, thereby satisfying the demand of manufacturing the first conductive trace layers and the second conductive trace layers with different trace density.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A silicon based substrate, comprising:
   a silicon wafer comprising a first surface and a second surface opposite to the first surface, and at least a through silicon via penetrating the first surface and the second surface;
   a first circuit substrate disposed on the first surface of the silicon wafer, the first circuit substrate comprising a plurality of first dielectric layers and a plurality of first conductive trace layers alternately stacked; and
   a second circuit substrate disposed on the second surface of the silicon wafer, the second circuit substrate comprising a plurality of second dielectric layers and a plurality of second conductive trace layers alternately stacked;
   wherein the at least a through silicon via is respectively electrically connected to the bottommost first conductive trace layer of the first circuit substrate and the uppermost second conductive trace layer of the second circuit substrate, the first dielectric layers comprise an inorganic material, and the second dielectric layers comprise an organic material.

2. The silicon based substrate as claimed in claim 1, wherein the inorganic material comprises silicon oxide, silicon nitride or silicon based material.

3. The silicon based substrate as claimed in claim 1, wherein the organic material comprises polyimide or benzocyclobutene.

4. The silicon based substrate as claimed in claim 1, further comprising:
   a first protecting layer covering the first circuit substrate; and
   a second protecting layer covering the second circuit substrate.

5. The silicon based substrate as claimed in claim 4, wherein the first circuit substrate further comprises an under bump metallization formed in a first opening of the first circuit substrate and electrically connected to the first conductive trace layers.

6. The silicon based substrate as claimed in claim 1, wherein the first circuit substrate further comprises a plurality of passive devices electrically connected to the first conductive trace layers.

7. A manufacturing method of a silicon based substrate, comprising:
   providing a silicon wafer comprising a first surface and a second surface opposite to the first surface;
   forming a plurality of first dielectric layers and a plurality of first conductive trace layers on the first surface of the silicon wafer by a wafer level semiconductor process, the first dielectric layers and the first conductive trace layers being alternately stacked to form a first circuit substrate;
   forming at least a through silicon via penetrating the first surface and the second surface of the silicon wafer, the at least a through silicon via being electrically connected to the bottommost first conductive trace layer of the first circuit substrate; and
   forming a plurality of second dielectric layers and a plurality of second conductive trace layers on the second surface of the silicon wafer, the second dielectric layers and the second conductive trace layers being alternately stacked to form a second circuit substrate, the uppermost second conductive trace layer of the second circuit substrate being electrically connected to the at least a through silicon via, wherein the trace density of the first conductive trace layers is higher than the trace density of the second conductive trace layers, the first dielectric layers comprise an inorganic material, and the second dielectric layers comprise an organic material.

8. The manufacturing method as claimed in claim 7, before forming the at least a through silicon via, further comprising performing a wafer thinning process, wherein the silicon wafer thinning process comprises:
   grinding the second surface of the silicon wafer so as to form a ground surface; and
   etching the grinding surface of the silicon wafer.

9. The manufacturing method as claimed in claim 7, wherein the step of forming the at least a through silicon via comprises:
   forming at least a through hole penetrating the first surface and the second surface of the silicon wafer so that a portion of the first conductive trace layers of the first circuit substrate is exposed from the at least a through hole;
   forming an insulating layer so as to cover the second surface of the silicon wafer and the sidewall of the at least a through hole; and
   forming an electrically conductive layer on the insulating layer and filled in the at least a through hole so that the first circuit substrate is electrically connected to the second circuit substrate through the electrically conductive layer.

10. The manufacturing method as claimed in claim 7, further comprising forming a first protecting layer covering the first circuit substrate.

11. The manufacturing method as claimed in claim 10, further comprising:
   forming a first opening in the first circuit substrate so as to expose a portion of the first conductive trace layers; and
   forming an under bump metallization in the first opening and electrically connected to the first conductive trace layers.

12. The manufacturing method as claimed in claim 7, further comprising forming a second protecting layer covering the second circuit substrate.

13. The manufacturing method as claimed in claim 7, further comprising forming a plurality of passive devices electrically connected to the first conductive trace layers in the first circuit substrate.

* * * * *